(12) United States Patent
Tsai et al.

(10) Patent No.: US 11,784,218 B2
(45) Date of Patent: Oct. 10, 2023

(54) GATE AIR SPACER PROTECTION DURING SOURCE/DRAIN VIA HOLE ETCHING

(71) Applicant: Taiwan Semiconductor Manufacturing Company, Ltd., Hsinchu (TW)

(72) Inventors: Kuo-Chiang Tsai, Hsinchu (TW); Jyh-Huei Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 100 days.

(21) Appl. No.: 17/145,017

(22) Filed: Jan. 8, 2021

(65) Prior Publication Data

US 2022/0223684 A1 Jul. 14, 2022

(51) Int. Cl.
*H01L 29/06* (2006.01)
*H01L 29/66* (2006.01)

(52) U.S. Cl.
CPC .... *H01L 29/0649* (2013.01); *H01L 29/66545* (2013.01)

(58) Field of Classification Search
CPC ........... H01L 29/0649; H01L 29/66545; H01L 29/0673; H01L 29/6653; H01L 29/6656; H01L 29/4991; H01L 21/764; H01L 21/823481
See application file for complete search history.

(56) References Cited

U.S. PATENT DOCUMENTS

| | | | |
|---|---|---|---|
| 8,796,666 B1 | 8/2014 | Huang et al. | |
| 8,815,712 B2 | 8/2014 | Wan et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,962,400 B2 | 2/2015 | Tsai et al. | |
| 8,963,258 B2 | 2/2015 | Yu et al. | |
| 9,093,514 B2 | 7/2015 | Tsai et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 11,362,193 B2* | 6/2022 | Cheng | H01L 29/0847 |
| 2013/0285116 A1 | 10/2013 | Lochtefeld et al. | |
| 2014/0051239 A1* | 2/2014 | Breyta | H01L 21/76897 257/E21.176 |
| 2017/0194423 A1* | 7/2017 | Lin | H01L 21/764 |
| 2017/0288031 A1* | 10/2017 | Ho | H01L 29/6656 |
| 2019/0043959 A1* | 2/2019 | Lee | H01L 29/6656 |

(Continued)

*Primary Examiner* — Dao H Nguyen
(74) *Attorney, Agent, or Firm* — HAYNES AND BOONE, LLP

(57) ABSTRACT

A semiconductor device includes a gate disposed over a substrate. A source/drain is disposed in the substrate. A conductive contact is disposed over the source/drain. An air spacer is disposed between the gate and the conductive contact. A first component is disposed over the gate. A second component is disposed over the air spacer. The second component is different from the first component.

20 Claims, 17 Drawing Sheets

(56) References Cited

U.S. PATENT DOCUMENTS

2019/0148374 A1* 5/2019 Bae .................... H01L 27/0207
                                                            257/401
2019/0334008 A1* 10/2019 Chen ................... H01L 29/4991
2020/0388694 A1* 12/2020 Cheng ................. H01L 29/6653

* cited by examiner

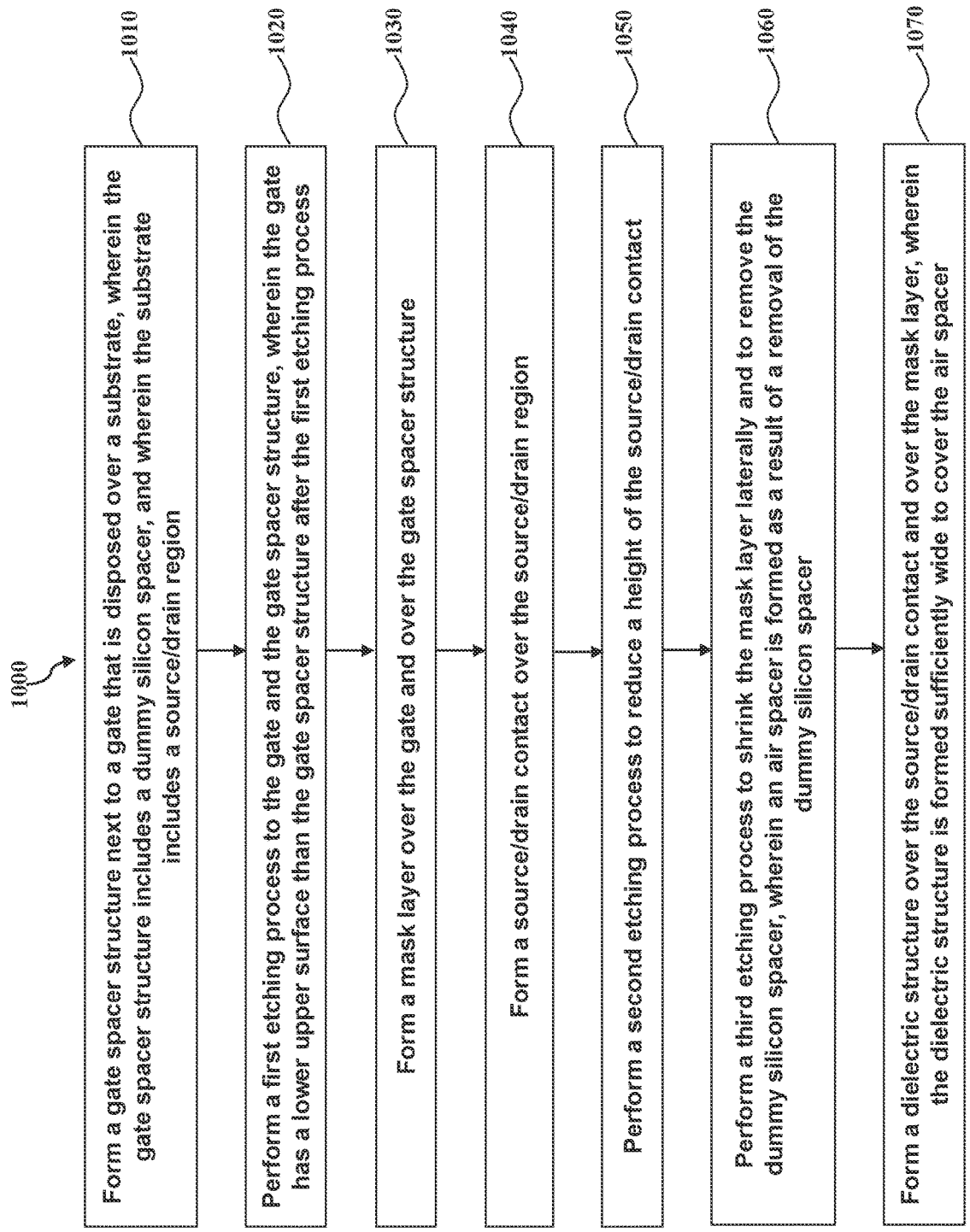

GATE AIR SPACER PROTECTION DURING SOURCE/DRAIN VIA HOLE ETCHING

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as semiconductor devices continue to get scaled down, accurate alignment between the various components of the IC is more difficult to achieve. In some cases, even a slight misalignment between a source/drain contact and a source/drain via (formed over the source/drain contact) may lead to electrical shorting between the source/drain via and a nearby gate structure. Electrical shorting is undesirable because it may degrade device performance or even cause device failures.

Therefore, although conventional methods of fabricating semiconductor devices have generally been adequate, they have not been satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 16 is a flowchart illustrating a method of fabricating a semiconductor device according to various aspects of the present disclosure.

DETAILED DESCRIPTION

Figure 1B:
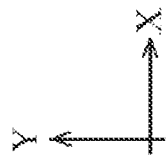
FIG. 1B is a planar top view of an IC device in the form of a FinFET according to various aspects of the present disclosure.
Figure 1B:
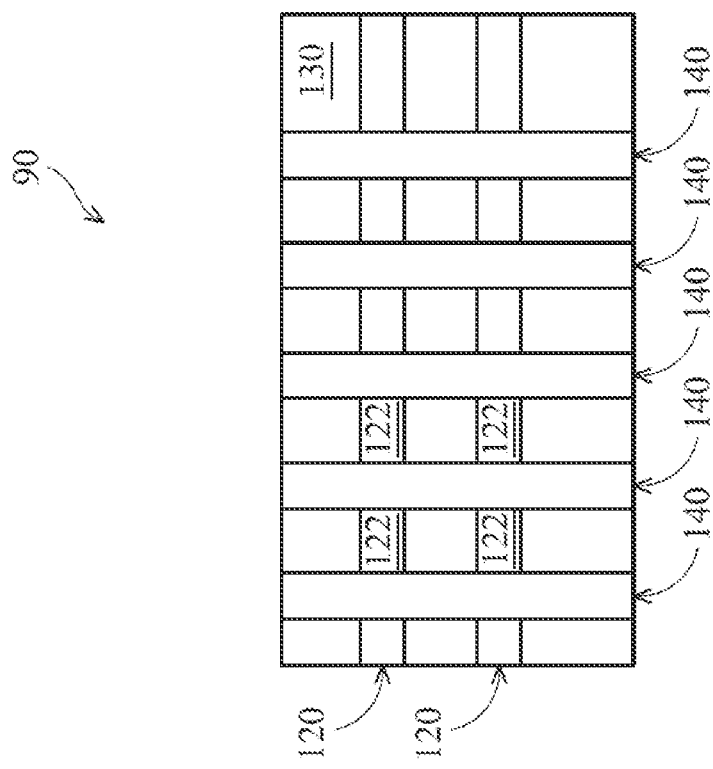

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to field-effect transistors (FETs), such as planar FETs, three-dimensional fin-line FETs (FinFETs), or gate-all-around (GAA) devices.

One aspect of the present disclosure involves forming a unique etching-stop layer to protect gate air spacers below during certain fabrication processes. In that regard, air spacers (as a part of the gate spacer structure) may help reduce the parasitic capacitance of ICs due to their low dielectric constant. However, conventional methods of semiconductor fabrication may lead to the air spacers being inadvertently punched through from above. This is also known as a tiger-tooth issue, which occurs when the source/drain via is misaligned with the source/drain contact. For example, when the source/drain via-hole is laterally shifted to a point where it is formed directly above the air spacer, the subsequent step of filling the source/drain via-hole with a conductive material may cause the conductive material to also at least partially fill the air spacer. In other words, due to the portion of the conductive material that protrudes into the air spacer, the source/drain via now has a downwardly-protruding "tiger-tooth"-like portion. Such a tiger-tooth-like profile may make the source/drain via more prone to come into direct contact with a nearby gate, which causes electrical shorting between the gate and the source/drain via (and the source/drain). When this occurs, device yield, reliability, and/or performance may be degraded.

The present disclosure overcomes this problem by reconfiguring the shape or profile of a protective layer, such as an etching-stop layer, so that the protective layer may block the air spacer during the source/drain via hole etching. As such, the air spacers can be preserved. In addition, such an implementation also allows the source/drain via to be self-aligned with the source/drain contact, which optimizes the process window, as discussed below in more detail.

Figure 1A:
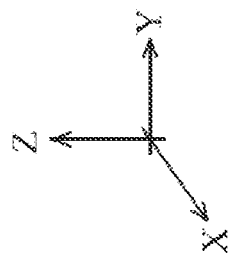
FIG. 1A is a perspective view of an IC device in the form of a FinFET according to various aspects of the present disclosure.
Figure 1A:
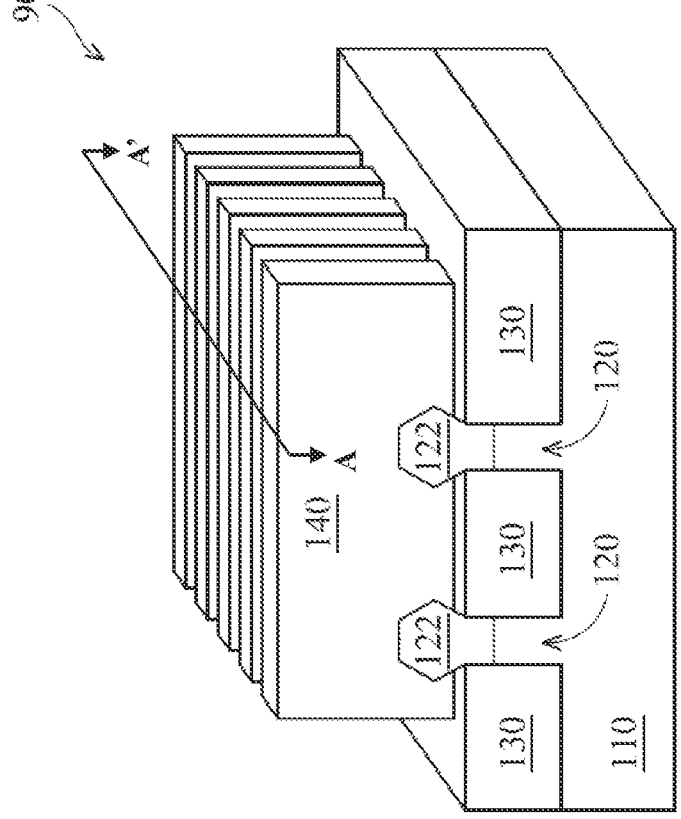

FIGS. 1A and 1B illustrate a three-dimensional perspective view and a top view, respectively, of a portion of an Integrated Circuit (IC) device 90. The IC device 90 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations, unless otherwise claimed. For example, although the IC device 90 as illustrated is a three-dimensional FinFET device, the concepts of the present disclosure may also apply to planar FET devices or GAA devices.

Referring to FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 are elongated fin-like structures that protrude upwardly out of the substrate 110. As such, the active regions 120 may be interchangeably referred to as fin structures 120 or fin structures 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120. The IC device 90 also includes source/drain features 122 formed over the fin structures 120. The source/drain features 122 may include epi-layers that are epitaxially grown on the fin structures 120.

The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. The gate structures 140 may be dummy gate structures (e.g., containing an oxide gate dielectric and a polysilicon gate electrode), or they may be HKMG structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIG. 1B, multiple fin structures 120 are oriented lengthwise along the X-direction, and multiple gate structure 140 are oriented lengthwise along the Y-direction, i.e., generally perpendicular to the fin structures 120. In many embodiments, the IC device 90 includes additional features such as gate spacers (including air spacers) disposed along sidewalls of the gate structures 140, hard mask layer (s) disposed over the gate structures 140, and numerous other features.

Figure 1C:
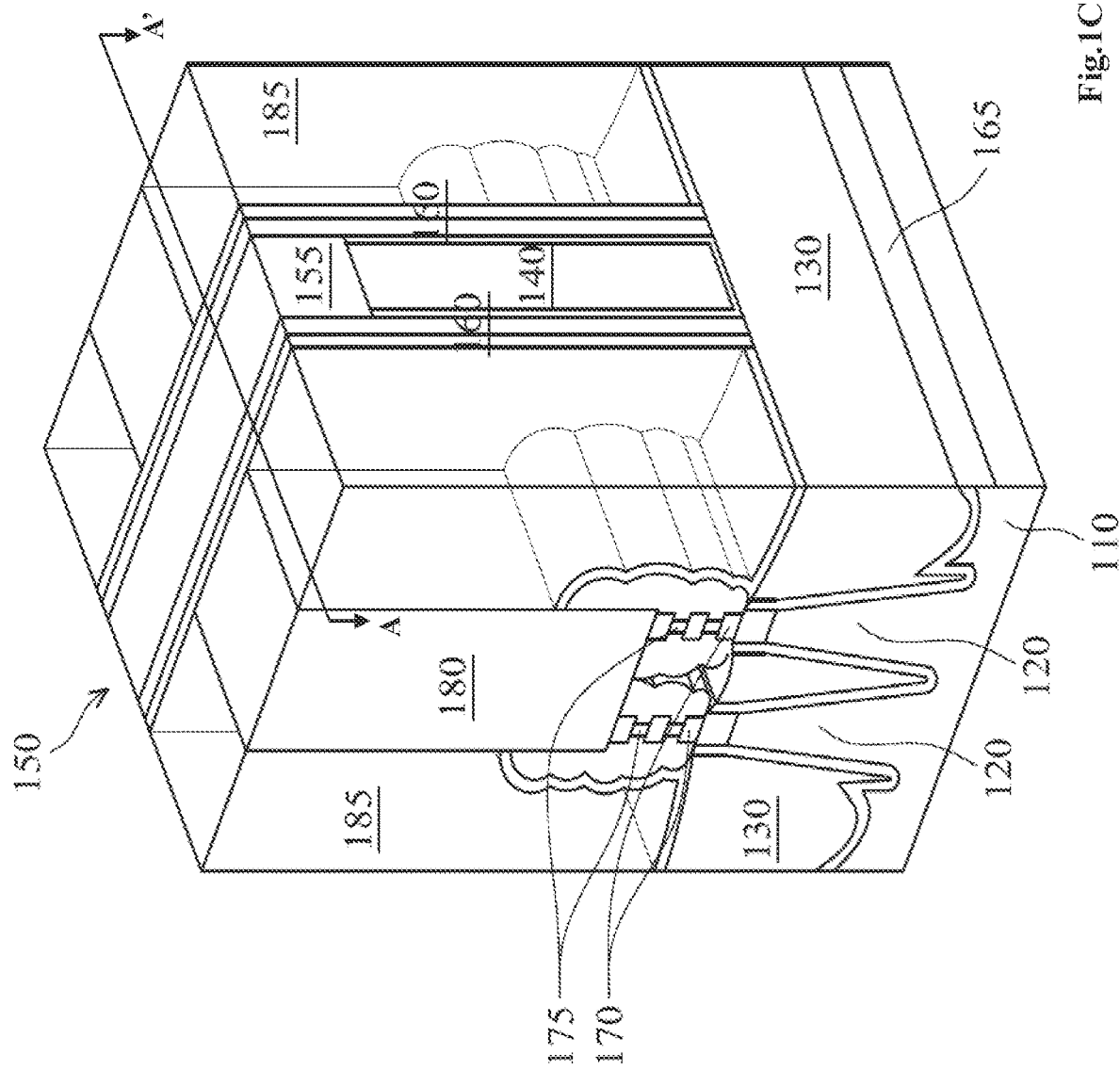
FIG. 1C is a perspective view of an IC device in the form of a GAA device according to various aspects of the present disclosure.

It is also understood that the various aspects of the present disclosure discussed below may apply to multi-channel devices such as Gate-All-Around (GAA) devices. FIG. 1C illustrates a three-dimensional perspective view of an example GAA device 150. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120.

The gate structure 140 is located over the fin structures 120 and over the isolation structures 130. A mask 155 is located over the gate structure 140, and gate spacer structures 160 (which may include air spacers) are located on sidewalls of the gate structure 140. A capping layer 165 is formed over the fin structures 120 to protect the fin structures 120 from oxidation during the forming of the isolation structures 130.

A plurality of nano-structures 170 are disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, and also in U.S. Pat. No. 9,887,269, titled "Multi-Gate Device and Method of Fabrication Thereof" and issued on Feb. 6, 2018, the disclosures of each which are hereby incorporated by reference in their respective entireties. To the extent that the present disclosure refers to a fin structure or FinFET devices, such discussions may apply equally to the GAA devices.

FIGS. 2-13 illustrate the cross-sectional side views of an IC device 200 at different stages of fabrication. FIGS. 2-13 correspond to the cross-sectional cuts taken along an X-direction, for example along the cutline A-A' in FIG. 1A. As such, FIGS. 2-13 may be referred to as X-cut Figures. For reasons of consistency and clarity, similar components appearing in FIGS. 1A-1C may be labeled the same in FIGS. 2-13.

Figure 2:
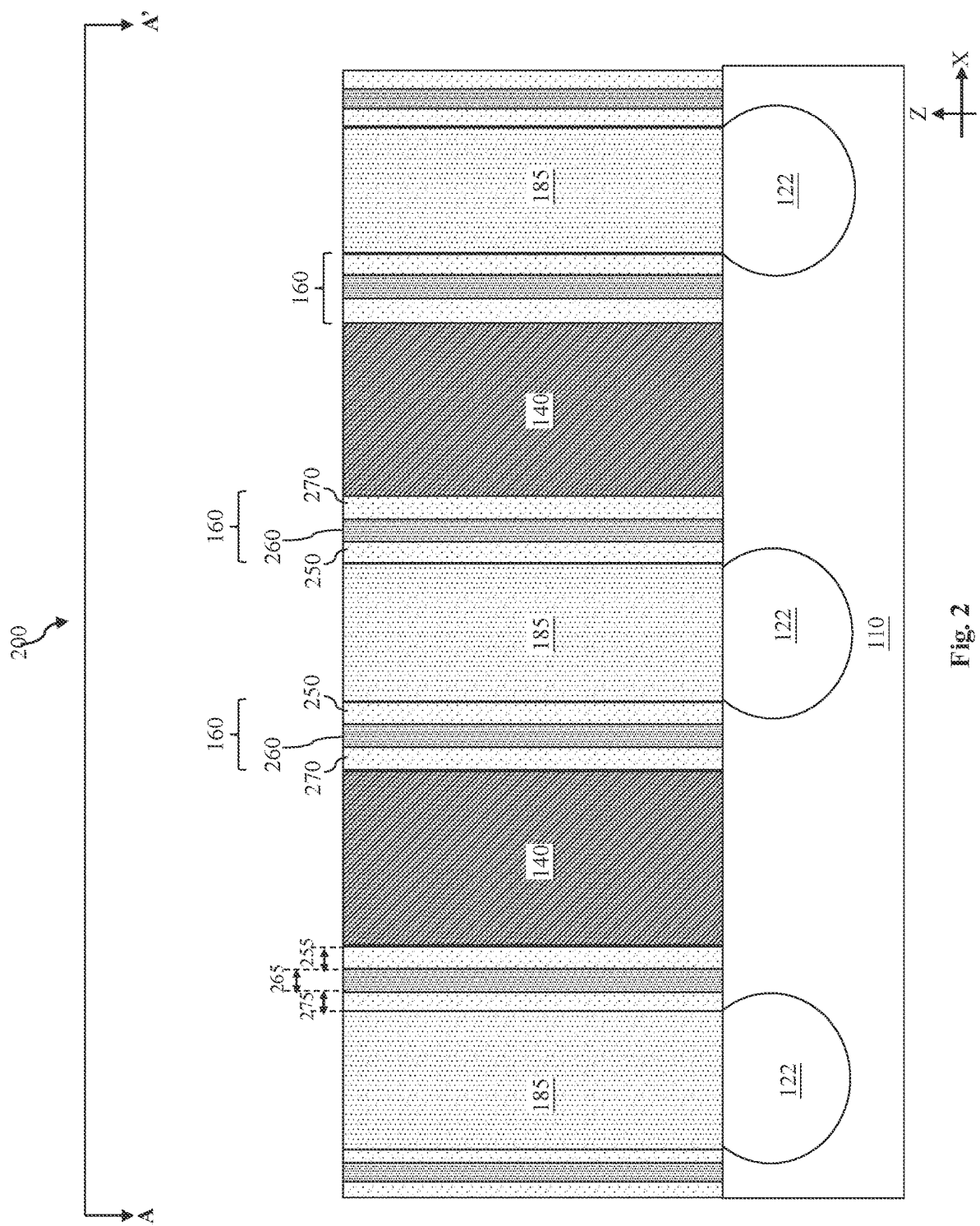
FIGS. 2-13 are cross-sectional side views of various embodiments of IC devices at various stages of fabrication according to various aspects of the present disclosure.

Referring to FIG. 2, the IC device 200 includes the substrate 110 discussed above with reference to FIGS. 1A-1C, for example a silicon substrate. The substrate includes a plurality of active regions, for example the fin structures 120 discussed above with reference to FIGS. 1A-1B. The fin structures 120 each extend laterally in the X-direction, and they are separated from one another in the Y-direction by the isolation structures 130. Source/drain components 122 may be formed in or over the substrate 110, which may be formed using an epitaxial growth process. In some embodiments, the source/drain components 122 are grown on/over the fin structures 120 (as shown in FIG. 2B). These source/drain components 122 may belong to different transistors.

The interlayer dielectric (ILD) 185 (also shown in FIG. 1C) is formed over the substrate 110. The ILD 185 may be formed by plasma enhanced chemical vapor deposition (PECVD), flowable CVD (FCVD), or other suitable methods. In some embodiments, the ILD 185 may include silicon oxide. In some other embodiments, the ILD 185 may include a low-k dielectric material having a dielectric constant that is less than the dielectric constant of silicon oxide (which is about 3.9). The ILD 185 may also be referred to as an ILD-0.

The IC device 200 also includes gate structures 140 (also shown in FIGS. 1A-1C) that are formed over the substrate 110. In some embodiments, the gate structures 140 include high-k metal gate (HKMG) gate structures, which may include a high-k gate dielectric and a metal gate electrode. The gate structures 140 may be performed using a gate replacement process. In more detail, dummy gate structures may be formed first over the substrate 110 and between the source/drain components 122. The dummy gate structures may each include a dummy gate electrode (e.g., a polysilicon gate electrode) and either a dummy gate dielectric (e.g., a silicon oxide gate dielectric) or a high-k gate dielectric (e.g., a dielectric material having a dielectric constant greater than that of silicon oxide).

After the formation of the dummy gate structures, gate spacer structures 160 (also shown in FIG. 1C) may be formed on the sidewalls of the dummy gate structures. In some embodiments, the gate spacer structures 160 may each include multiple gate spacers, for example a gate spacer 250, a gate spacer 260, and a gate spacer 270. The gate spacer 250 is disposed directly on the sidewall of the dummy gate structure and may include a low-k dielectric material. The gate spacer 260 is disposed on the sidewall of the gate spacer 250 and may include a silicon material. Note that this silicon material will be removed in a later process to form air spacers, and therefore the gate spacer 250 may also be referred to as a dummy silicon spacer. The gate spacer 270 is disposed on the sidewall of the gate spacer 260 and may include a dielectric material such as silicon nitride. In this configuration, the gate spacer 260 is formed between the gate spacers 250 and 270. It is understood that the ILD 185 may be formed after the formation of the gate spacer structures 160.

As a part of the gate replacement process, the dummy polysilicon gate electrodes of the dummy gate structures may be removed using one or more etching processes, which leaves openings (trenches) defined by the gate spacer structures 160 and the ILD 185. These openings or trenches are subsequently filled by the metal gate electrodes of the gate structures 140. In some embodiments, if the dummy gate structures include a dummy gate dielectric (e.g., a silicon oxide gate dielectric), then the dummy gate dielectric will also be replaced by a high-k gate dielectric as a part of the gate structures 140. Example materials of the high-gate k dielectric include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or combinations thereof. The metal gate electrode is formed on the high-k gate dielectric and may include one or more work function metal layers and one or more fill metal layers. The work function metal layers may be configured to tune a work function of the respective transistor. Example materials for the work function metal layers may include titanium nitride (TiN), Titanium aluminide (TiAl), tantalum nitride (TaN), titanium carbide (Tic), tantalum carbide (TaC), tungsten carbide (WC), aluminum titanium nitride (TiAlN), zirconium aluminide (ZrAl), tungsten aluminide (WAl), tantalum aluminide (TaAl), hafnium aluminide (HfAl), or combinations thereof. The fill metal layer may serve as a main conductive portion of the gate electrode. In some embodiments, the HKMG structures 140 may include additional layers, such as interfacial layers, capping layers, diffusion/barrier layers, or other applicable layers.

As semiconductor fabrication progresses to smaller technology nodes, the sizes or dimensions of the various components of the IC device will shrink, including the gate spacer structure 160. This may increase difficulties in fabrication, such as alignment issues. For example, the gate spacers 250, 260, and 270 may have lateral dimensions (e.g., widths) 255, 265, and 275, respectively, that are measured in the X-direction. The lateral dimensions 255, 265, and 275 may shrink as semiconductor fabrication progresses to smaller technology nodes. In some embodiments, the lateral dimensions 255, 265, and 275 may each be in a range between about 0.1 nanometer (nm) and about 2.5 nm. Such small sizes may bring certain fabrication challenges.

For example, in a later fabrication process discussed below, the portions of the ILD 185 disposed directly over the source/drain components 122 may be removed and replaced by source/drain contacts, and a source/drain via may be formed over the source/drain contact. In another fabrication process discussed below, the gate spacer 260 will be removed and replaced by an air spacer. Due to the small lateral dimension 265 of the gate spacer 260, even a slight lateral shift of the location of the source/drain via could cause the source/drain via to leak into the air spacer. This is referred to as a tiger-tooth problem and is undesirable, since the presence of the metal materials of the source/drain via inside what is supposed to be air compromises the intended functionality of the air spacer.

The tiger-tooth problem could also lead to the unintended electrical shorting between the source/drain via and one of the nearby gate structures 140. For example, due to their small lateral dimensions 255 and 275, the gate spacers 250 and 270 may be inadvertently consumed in one or more later etching processes that are meant to etch other components of the IC device 200. Again, the inadvertent consumption of the gate spacers 250 and/or 270 may allow the metal materials of the source/drain via to leak into what is supposed to be the gate spacer structure 160. In some cases, the leakage of the source/drain via (e.g., the downwardly-protruding tiger-tooth) may come into direct physical contact with one of the nearby gate structures 140, which results in electrical shorting between the gate structure 140 and the source/drain via (and therefore the source/drain component 122). To overcome these problems, the present disclosure prevents the occurrence of the tiger-tooth source/drain via by forming a uniquely shaped etching-stop layer, as discussed below in more detail.

Figure 3:
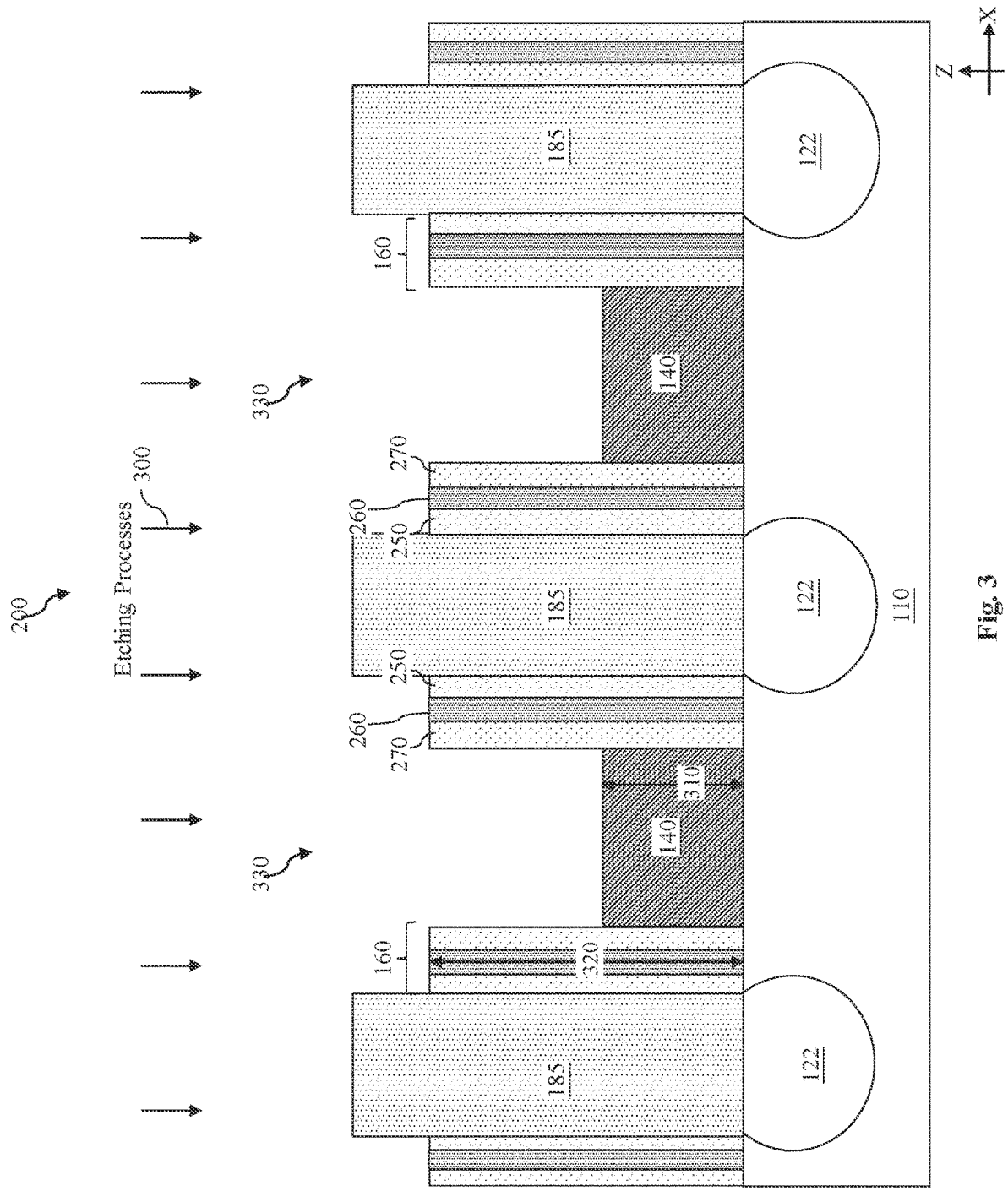

Referring now to FIG. 3, one or more etching processes 300 are performed to the IC device 200. In some embodiments, the one or more etching processes 300 may include etch-back processes to reduce the height of the gate structures 140 and the height of the gate spacer structures 160. As a result of the one or more etching processes 300 being performed, the gate structures 140 have been reduced to a height 310. In some embodiments, the height 310 is in a range between about 5 nm and about 20 nm. The gate spacer structures 160 also have a reduced height 320, which is still taller than the height 310 of the gate structures 140. The ILD 185 is substantially unremoved, or at least not removed as much as the gate spacer structures 160 or the gate structures 140 by the etching processes 300. As such, the partial removal of the gate spacer structures 160 and the gate structures 140 form openings 330 (or recesses 330).

Figure 4:
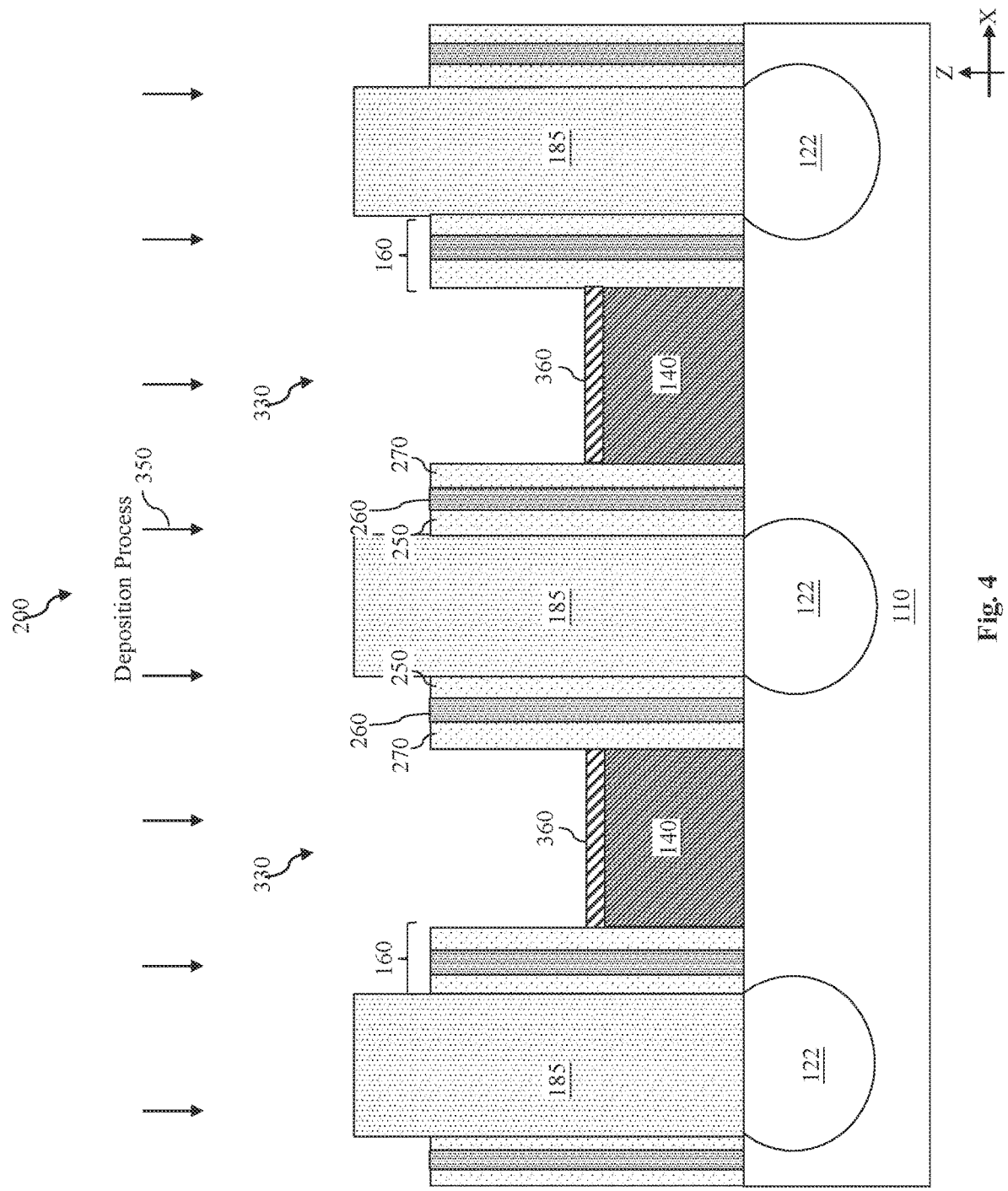

Referring now to FIG. 4, a deposition process 350 is performed to form a metal layer 360 over the upper surface of each of the gate structures 140. The deposition process 350 may include atomic layer deposition (ALD), physical vapor deposition (PVD), or CVD. In some embodiments, the metal layer 360 is formed to contain ruthenium (Ru), cobalt (Co), copper (Cu), aluminum (Al), or another suitable pure metal. In some embodiments, the metal layer 360 is formed to have a thickness in a range between about 1 nm and about 7 nm.

Figure 5:
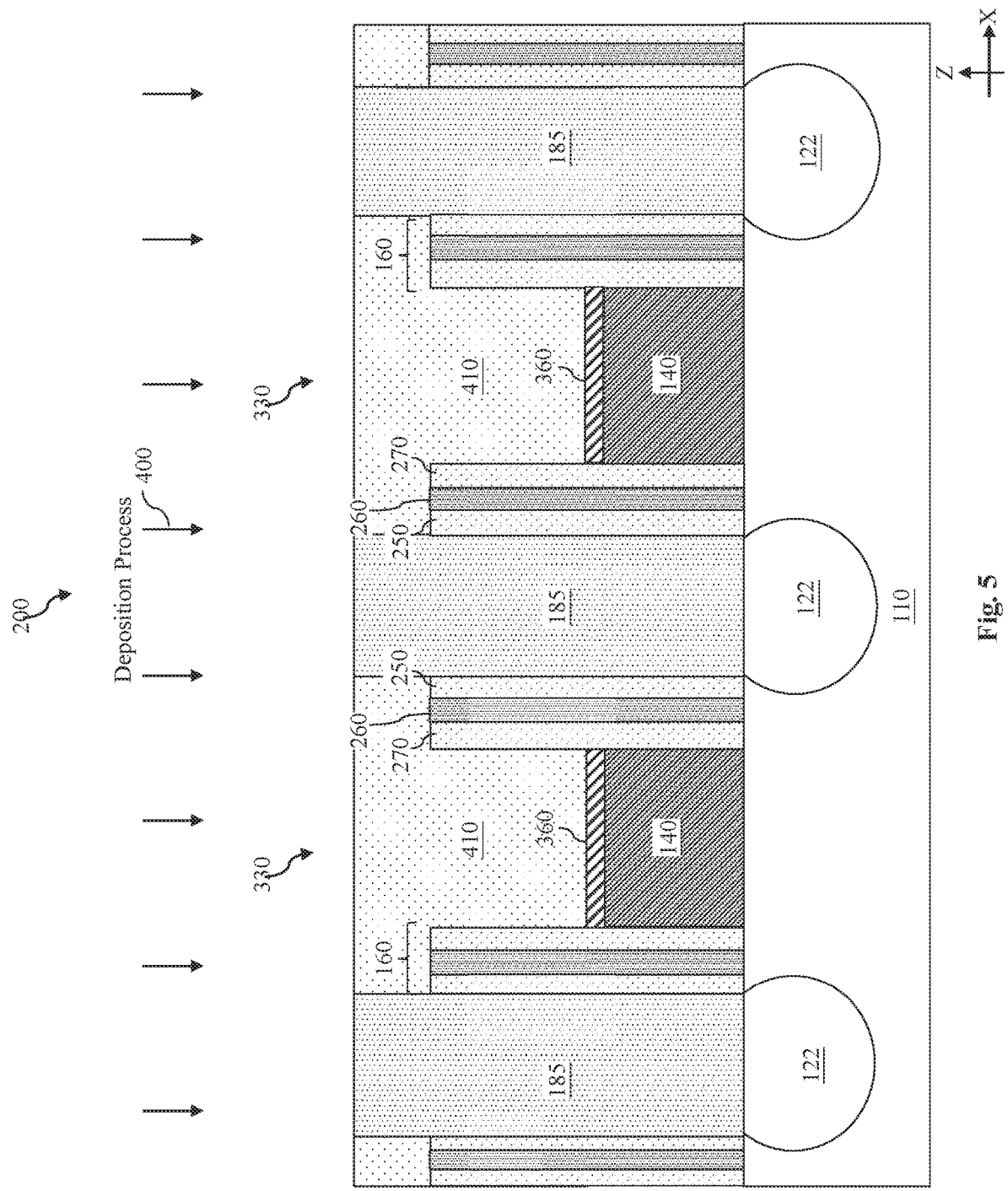

Referring now to FIG. 5, a deposition process 400 is performed to the IC device 200 to form a hard mask layer 410 over the metal layer 360 and over the gate structures 160. The deposition process 400 may include CVD, PVD, ALD, or combinations thereof. In some embodiments, the hard mask layer 410 may include a metal oxide, such as tantalum oxide ($Ta_2O_5$), aluminum oxide ($Al_2O_3$), or zirconium oxide ($ZrO_2$). In some embodiments, the hard mask layer 410 may include silicon nitride (SiN) or silicon oxynitride (SiON). In some embodiments, the hard mask layer 410 may include a nitrogen content oxide, a nitrided oxide, a metal oxide dielectric, a hafnium content oxide (e.g., an oxide material having a hafnium content), a tantalum content oxide, a titanium content oxide, a zirconium content oxide, an aluminum content oxide, a lanthanum content oxide, or a high-K dielectric material, or combinations thereof. The hard mask layer 410 fills the openings 330. It is understood that a planarization process such as a chemical mechanical polishing (CMP) process may also be performed to planarize the upper surfaces of the hard mask layer 410 and the upper surfaces of the ILD 185.

Figure 6:
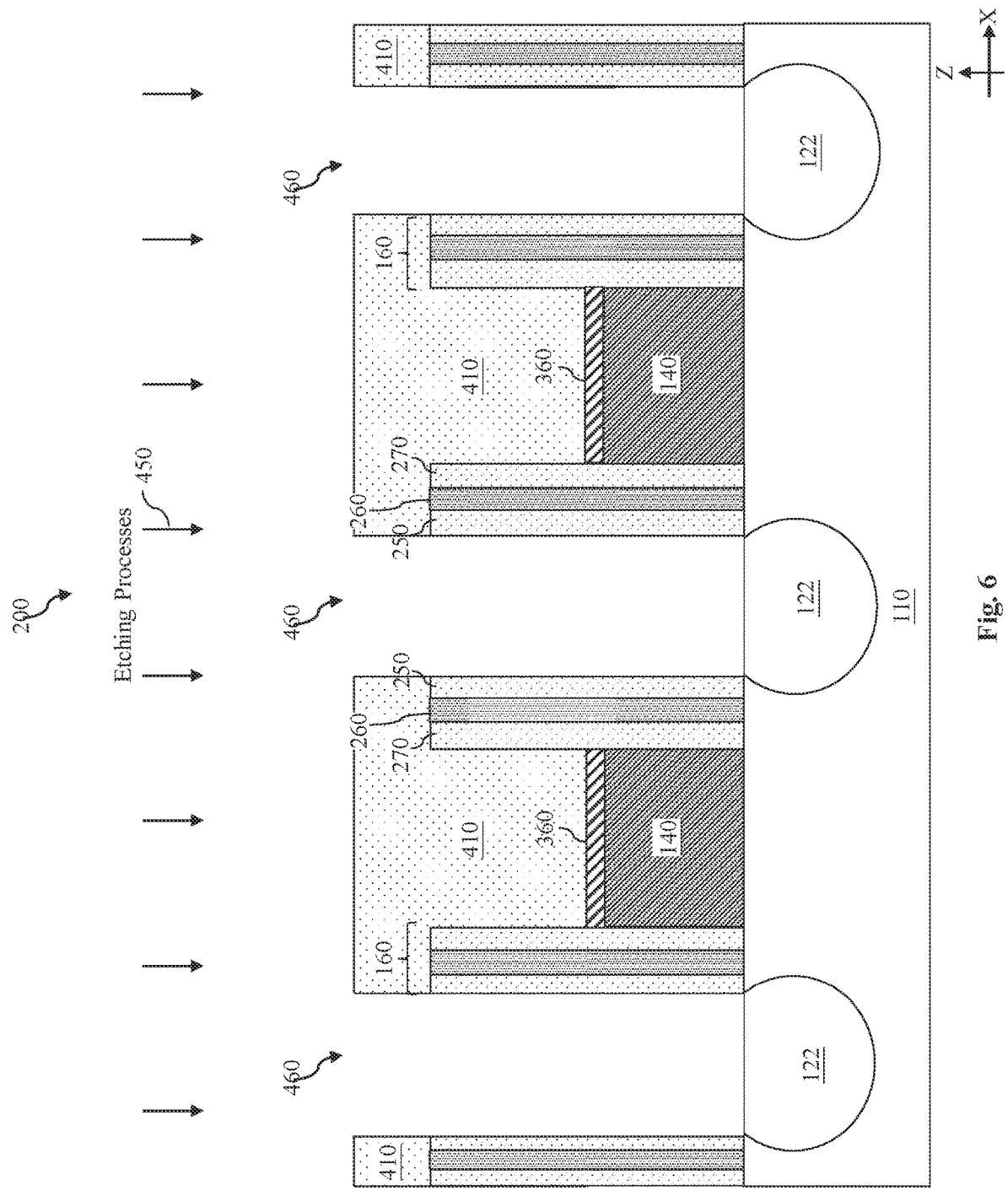

Referring now to FIG. 6, one or more etching processes 450 may be performed to the IC device 200 to remove the ILD 185. The one or more etching processes 450 may include a wet etching process, a dry etching process, or a combination thereof. The removal of the ILD 185 forms openings 460 in place of the removed ILD 185, which expose the upper surfaces of the source/drain components 122.

Figure 7:
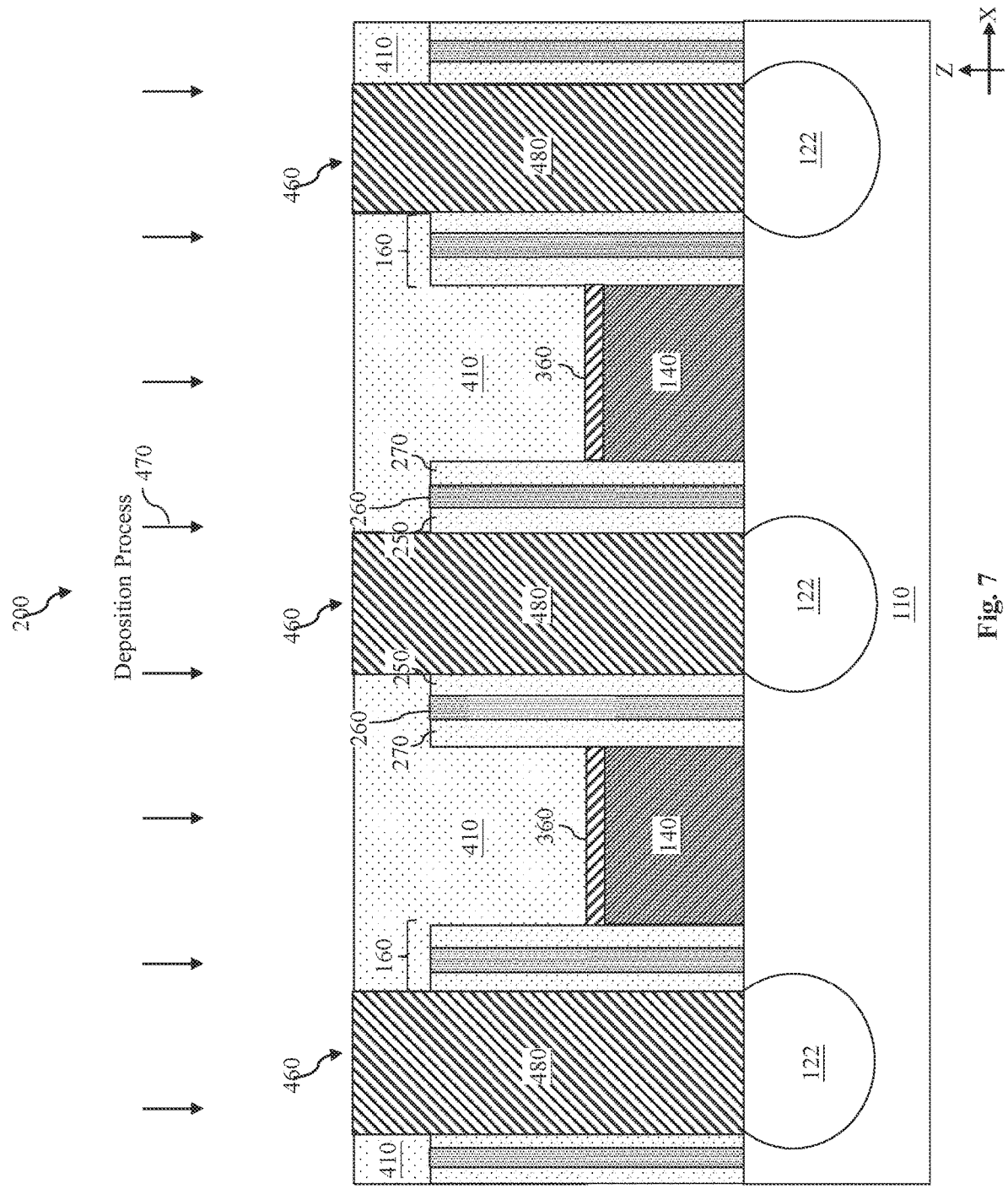

Referring now to FIG. 7, a deposition process 470 is performed to the IC device 200 to form conductive contacts 480 in the openings 460. Since the conductive contacts 480 are formed on the source/drain components 122, they may also be referred to as source/drain contacts 480. In some embodiments, the deposition process 470 includes a suitable deposition process such as CVD, PVD, or ALD. In some embodiments, the source/drain contacts 480 may contain a combination of titanium/titanium nitride and another metal such as cobalt, tantalum, tantalum nitride, ruthenium, copper, aluminum, or another pure metal. It is understood that a CMP process may also be performed to planarize the upper surfaces of the source/drain contacts 480 and the hard mask layer 410. The source/drain contacts 480 provide electrical connectivity to the source/drain components 122.

Figure 8:
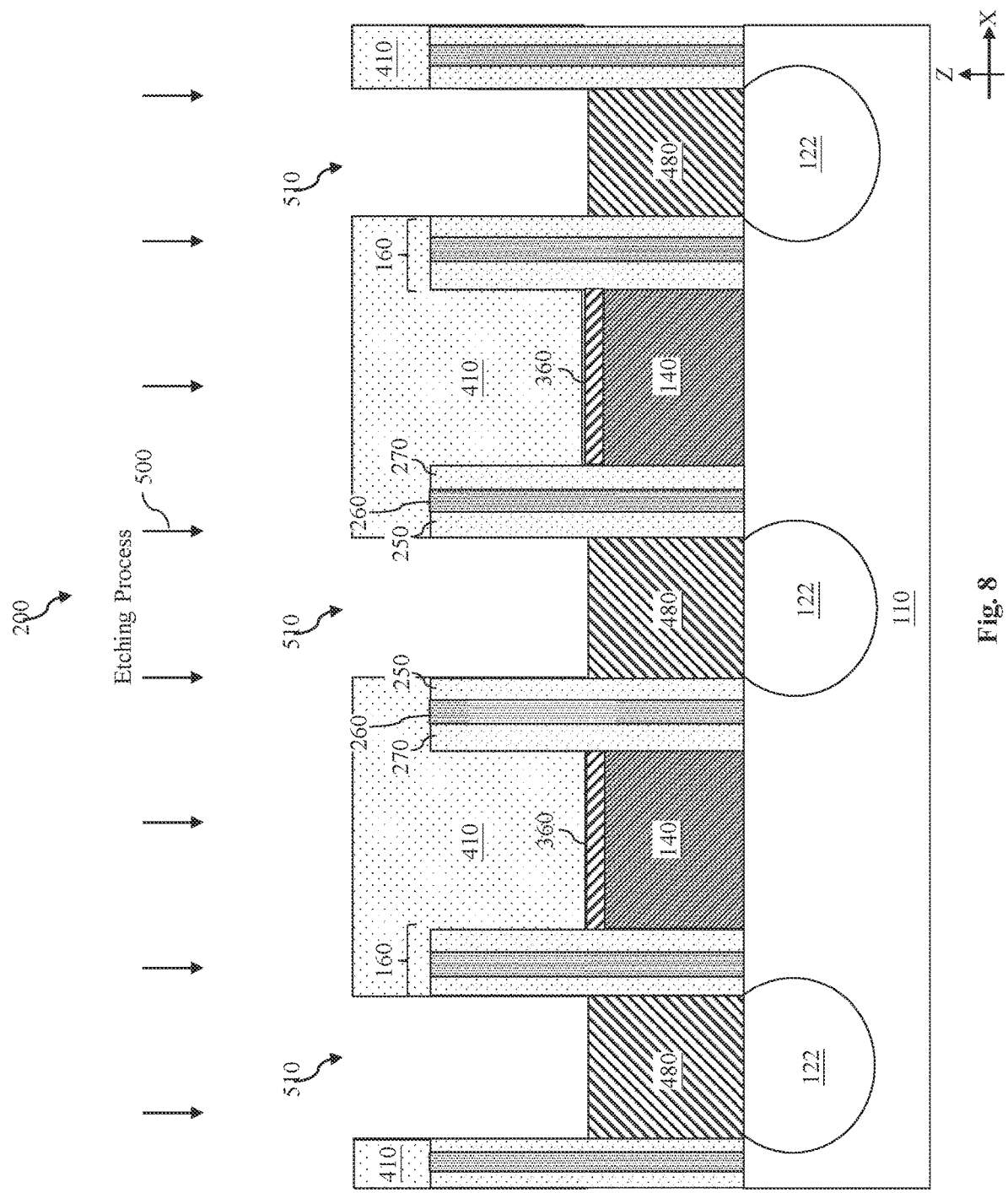

Referring now to FIG. 8, an etching process 500 is performed to the IC device 200 to partially remove the source/drain contacts 480. In some embodiments, the etching process 500 may include an etching-back process. The process parameters of the etching process 500 may be configured such that the remaining portions of the source/drain contacts 480 have substantially similar heights as the combination of the metal layer 360 and the gate structures 140. Alternatively stated, at the end of the etching process 500, the upper surfaces of the source/drain contacts 480 may be substantially co-planar with the upper surfaces of the metal layers 360.

Figure 9:
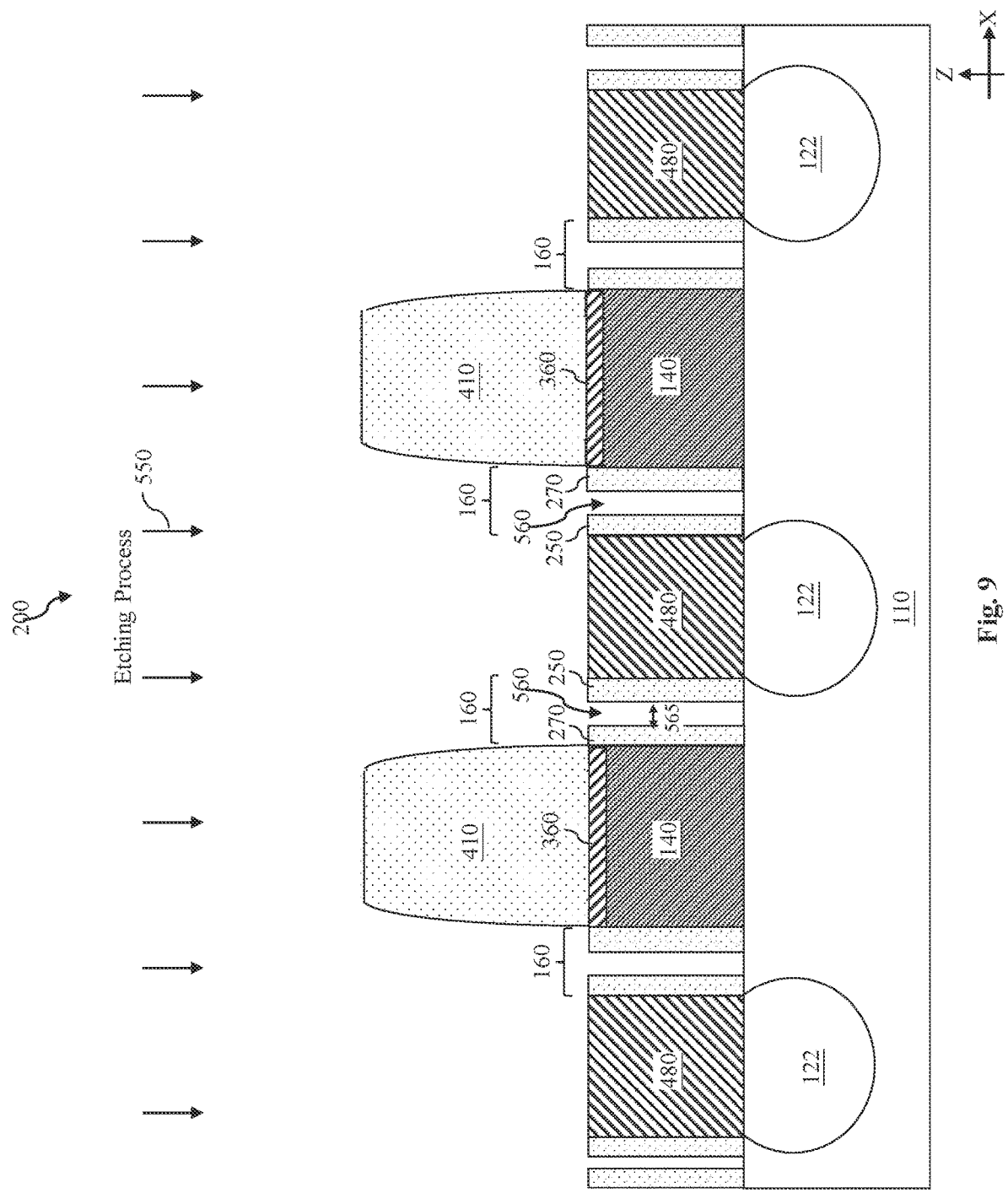

Referring now to FIG. 9, an etching process 550 is performed to the IC device. In some embodiments, the etching process 550 includes a wet etching process. The etching process 550 reduces the lateral dimension (e.g., in the X-direction) of the hard mask layer 410, until at least the dummy silicon gate spacers 260 are exposed. The etching process 550 (or a subsequent etching process) then etches away the dummy silicon gate spacers 260, such that air spacers 560 are formed in place of the removed dummy silicon gate spacers 260.

As shown in FIG. 9, the air spacers 560 are located between the gate spacers 250 and 270. The air spacers 560 have a low dielectric constant (e.g., approximately 1) and therefore will help lower the parasitic capacitance of the transistor. The air spacers 560 each have a lateral dimension 565 (e.g., measured in the X-direction). In some embodiments, the lateral dimension 565 is in a range between about 0.5 nm and about 5 nm. The range for the dimension 565 is not randomly chosen but rather specifically configured to optimize the parasitic capacitance reduction without removing too much of the gate spacers 250 and/or 270, which are still needed to provide electrical isolation.

It is understood that the etching process 550 not only partially removes the hard mask layer 410, but it also partially removes the gate spacer structure 160. In other words, the remaining portions of the gate spacers 250 and 270 may have heights that are substantially equal to or lower than the heights of the source/drain contacts 480. It is also understood that while the illustrated embodiment shows that the sidewalls of the remaining portion of the hard mask layer 410 are approximately aligned with the sidewalls of the gate structure 140 below, this need not be the case in other embodiments. In some embodiments, the hard mask layer 410 may be etched a little bit more laterally, such that portions of the gate structures 140 below are exposed. In yet other embodiments, the hard mask layer 410 may be etched a little bit less laterally, such that the remaining portion of the hard mask layer 410 may partially cover up the upper surfaces of the gate spacers 270, so long as the dummy silicon gate spacers 260 can be exposed and removed to form the air spacers 560.

Figure 10:
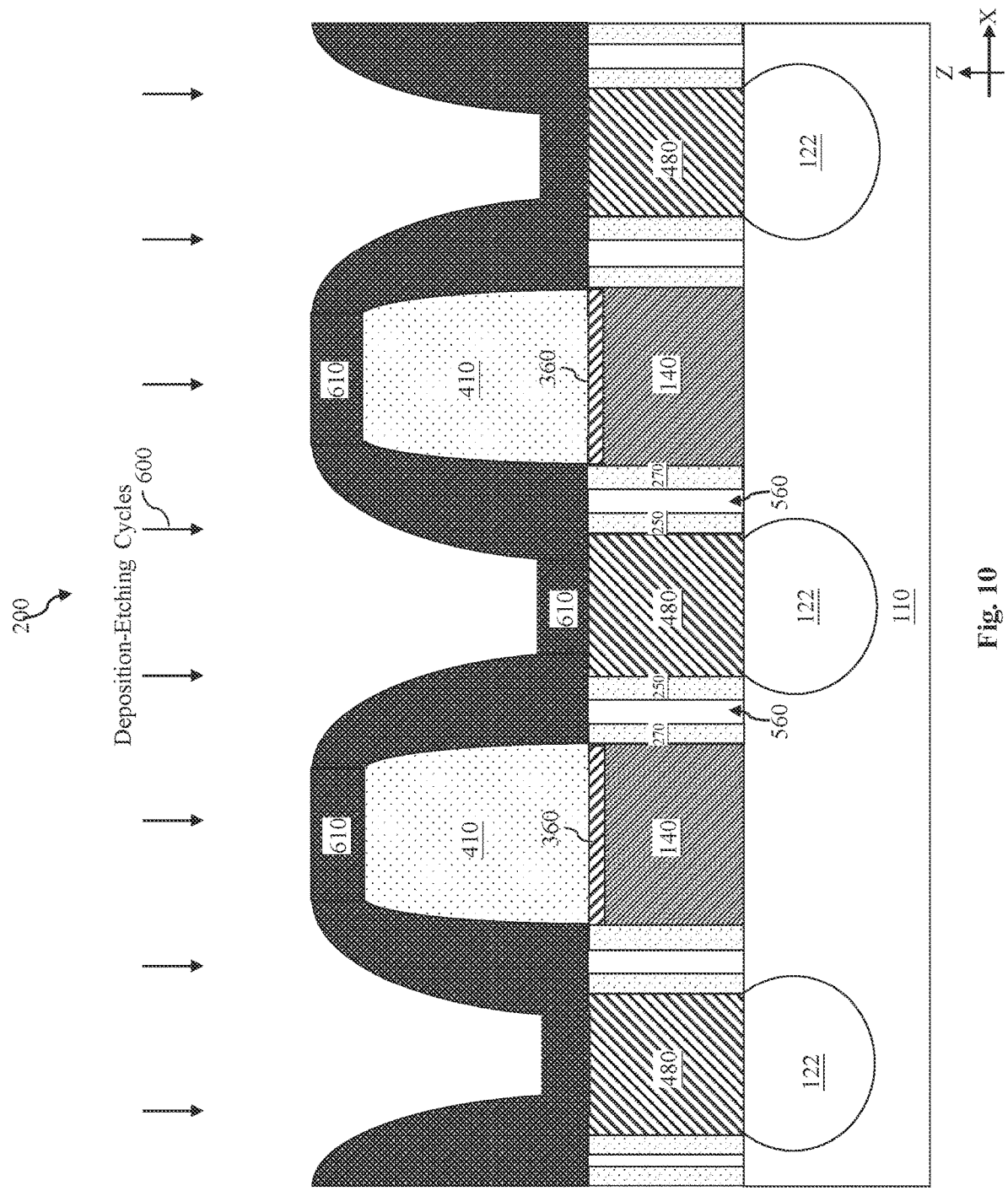

Referring now to FIG. 10, a plurality of deposition-etching cycles 600 are performed to the IC device 200 to form an etching-stop layer (ESL) 610. In a first step of each cycle of the deposition-etching cycles 600, a deposition process is performed to deposit a dielectric material of the ESL 610. In some embodiments, the deposition process includes ALD, which can be configured to precisely control a thickness of the deposited dielectric material. In some embodiments, the deposited dielectric material may have a different material composition than the hard mask layer 410. For example, in some embodiments, the deposited material of the ESL 610 includes silicon nitride, while the hard mask layer 410 includes a metal oxide material. In a second step of each cycle of the deposition-etching cycles 600, a dry etching process is performed to etch the deposited material of the ESL 610, mostly in a downward vertical direction (e.g., in the downward Z-direction). This is because the dry etching process can be performed anisotropically, for example it may etch in the downward vertical direction much more than in lateral directions (in the X-directions).

As a result of the performance of the deposition-etching cycles 600, the deposited ESL 610 is formed to have substantially thicker dimensions laterally than vertically. In some embodiments, the lateral dimension of the ESL 610 is at least 33% thicker than its vertical dimension. This characteristic allows the ESL 610 to cover up the air spacer 560 without unduly increasing the thickness of the portion of the ESL 610 disposed above the source/drain contact 480. Therefore, the relatively wide portion of the ESL 610 can adequately protect the air spacers 560 below, while the relatively thin portion of the ESL 610 can be easily etched through in a later process to expose the source/drain contact 480.

Figure 11:
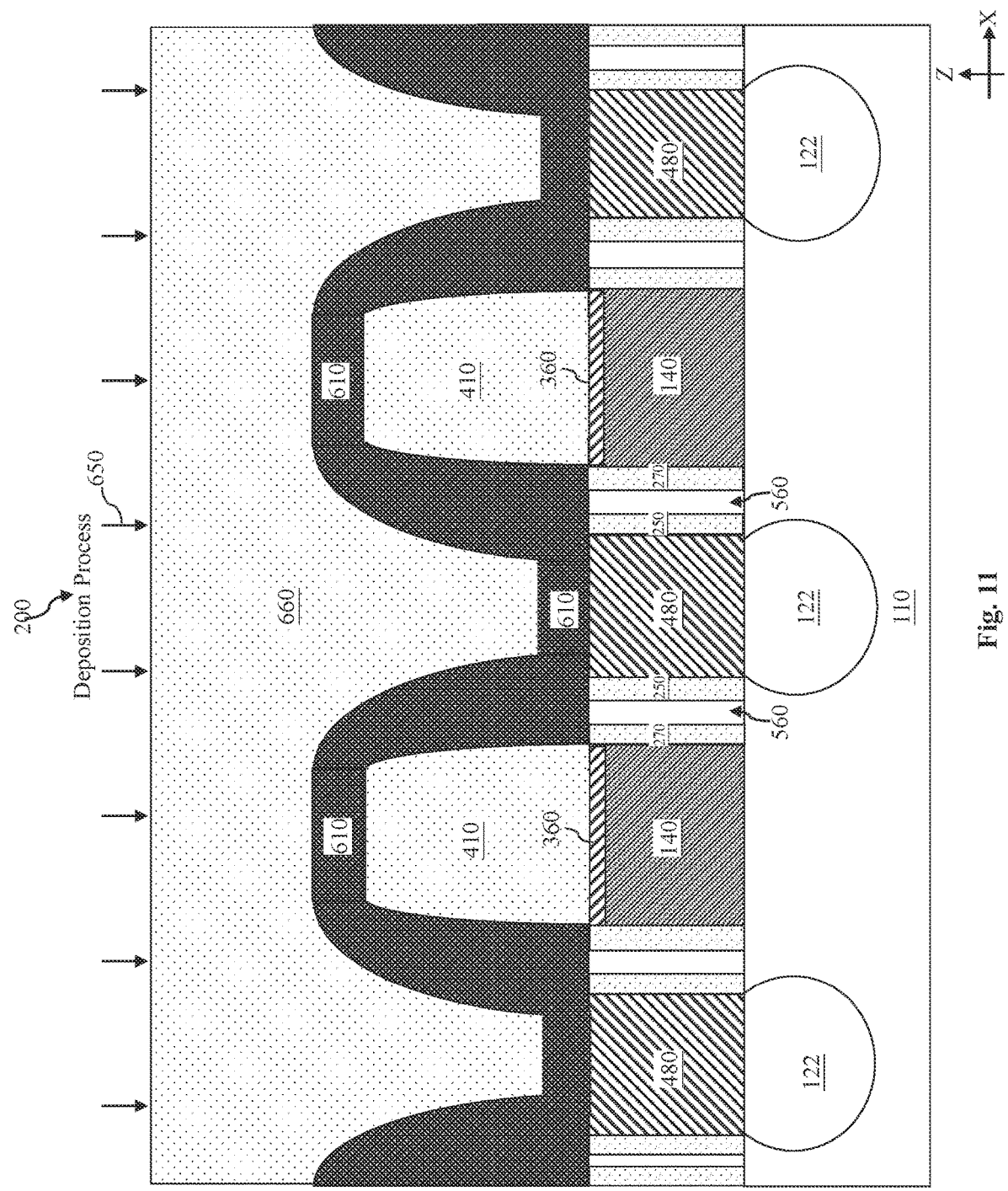

Referring now to FIG. 11, a deposition process 650 is performed to the IC device 200. The deposition process 650 may include CVD, PVD, ALD, or combinations thereof. The deposition process 650 deposits a dielectric layer over the ESL 610 as the ILD 660. The ILD 660 may also be referred to as an ILD2. In some embodiments, the ILD 660 includes silicon oxide.

Figure 12:
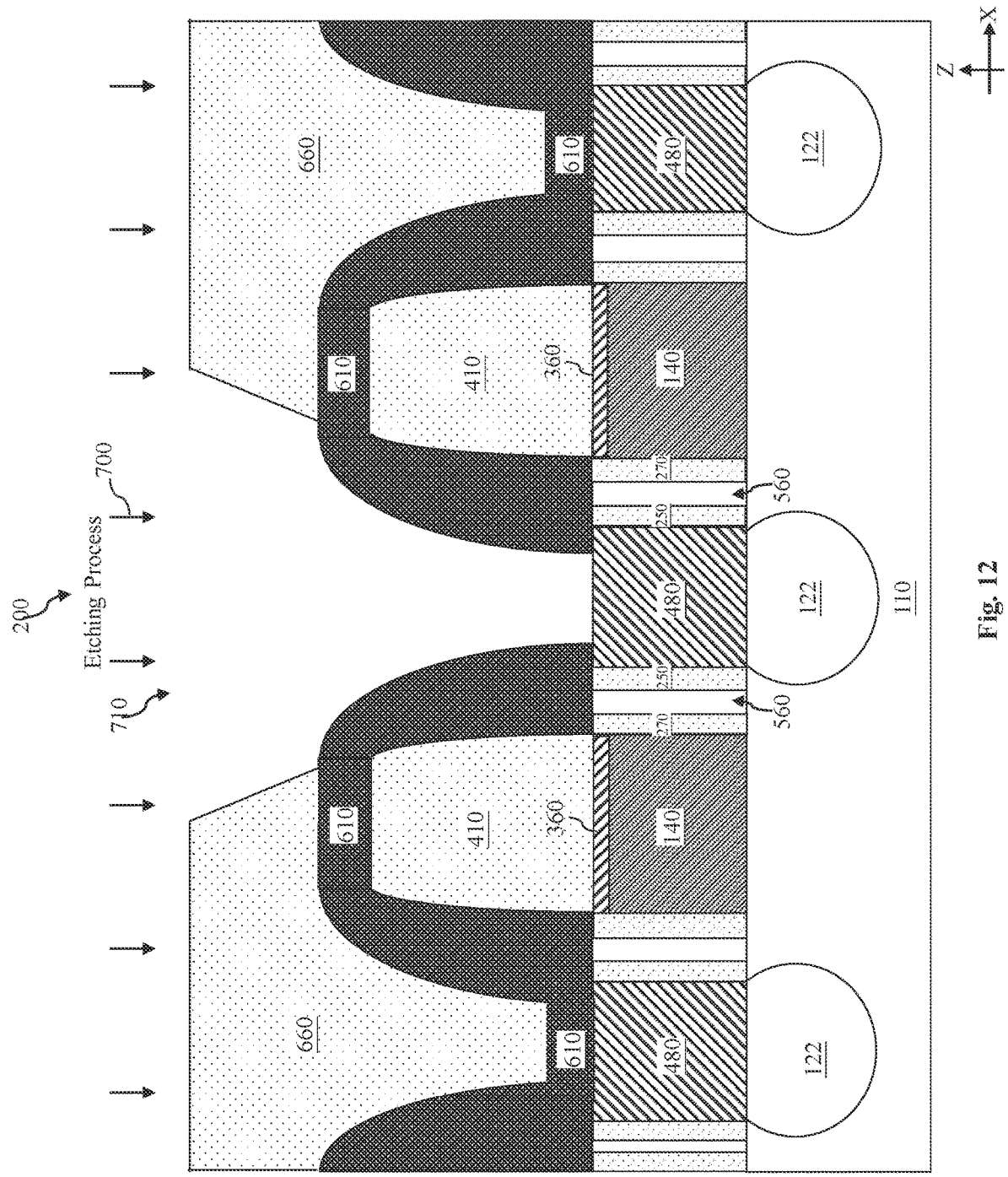

Referring now to FIG. 12, an etching process 700 is performed to the IC device 200 to form an opening 710. The opening 710 extends vertically through a portion of the ILD 660 and a portion of the ESL 610 to expose an upper surface of one of the source/drain contacts 480. Note that since portions of the ESL 610 protect the air spacers 560 below during the etching process 700. Since the opening 710 will be filled by a conductive material subsequently to establish electrical connections with the source/drain contact 480 (and therefore with the source/drain components 122), the opening 710 may also be referred to as a source/drain via hole.

Figure 13:
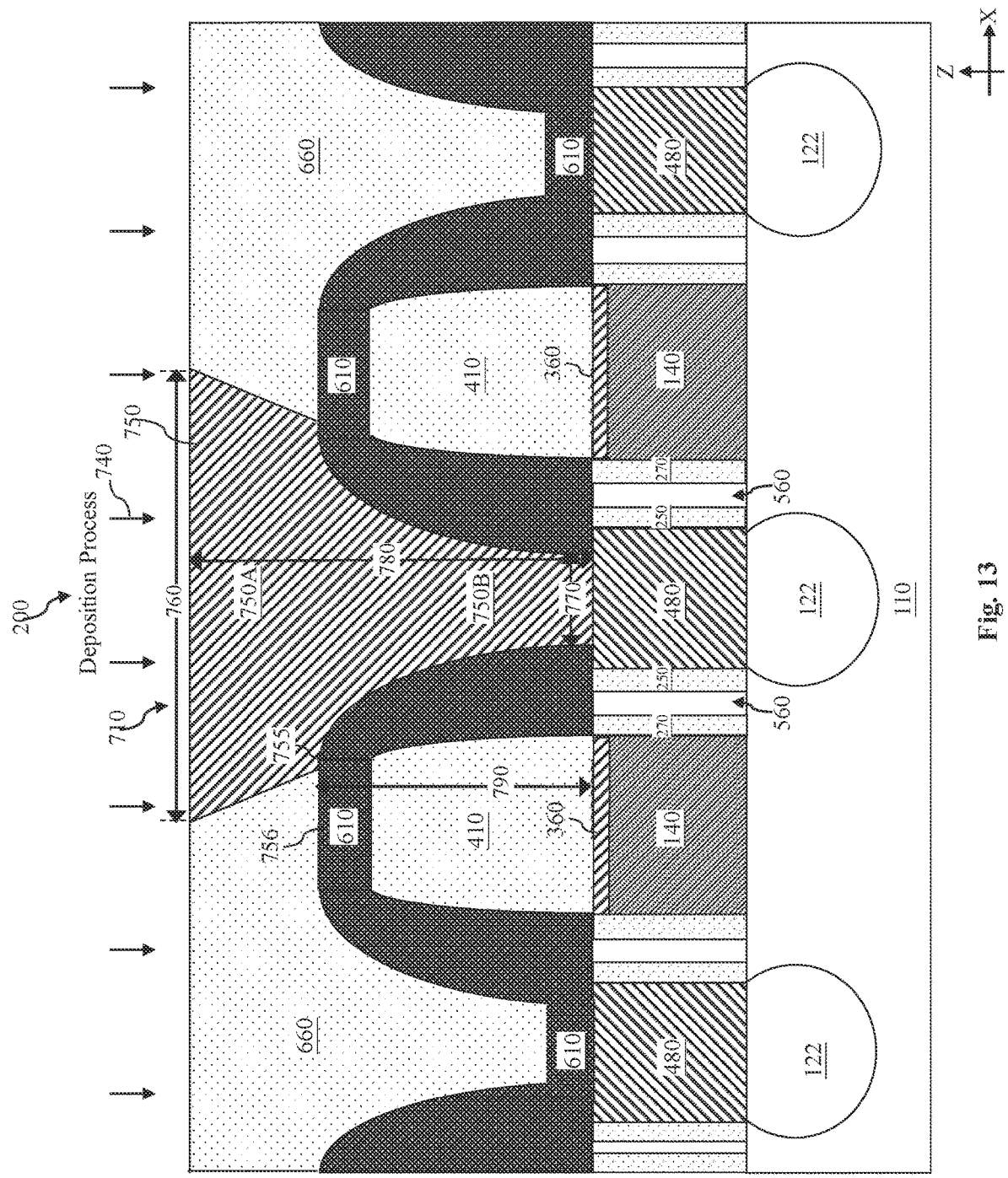

Referring now to FIG. 13, a deposition process 740 is performed to the IC device 200 to form a source/drain via 750. The source/drain via 750 is formed by filling the opening 710 with a conductive material, such as tungsten, cobalt, copper, or aluminum. Due to the unique fabrication processes performed to form the source/drain via 750, the source/drain via 750 is formed in a self-aligned manner. For example, the upper portion of the opening 710 can be etched to be substantially wider than the bottom portion of the opening 710, or even wider than the source/drain contact 480. Since the ESL 610 protects the air spacer 560 (and also the gate spacers 250 and 270 below from being etched) during the etching process 700, the risk of the opening 710 bridging with the air spacer 560 is substantially reduced or eliminated. As such, the opening 710 (or the source/drain via 750 subsequently filling the opening 710) need not be sufficiently narrow and exactly aligned with the source/drain contact 480. In other words, the source/drain via 750 can have a cross-sectional view profile that resembles the letter "T" where it has a wider upper portion 750A (which relaxes the processing window when the source/drain via 750 was etched) and a narrower lower portion 750B. The upper portion 750A has a bottom surface 755 that is disposed directly on an upper surface 756 of the ESL 610. The side surfaces of the upper portion 750A are also in direct contact with the ILD 660. Meanwhile, the sidewalls of the lower portion 750B are in direct contact with the side surfaces of the ESL 610, and the bottom surface of the lower portion 750B are in direct contact with the top surface of the source/drain contact 480, so that electrical connectivity with the source/drain component 122 can be established. Even if the opening 710 shifts laterally to the "left" or "right" in the X-direction, such as a shift is unlikely to disrupt the electrical connection between the source/drain via 750 and the source/drain contact 480, because the ESL 610 effectively "guide" the opening 710 to be formed in an aligned manner with the source/drain contact 480 below.

In some embodiments, a top surface of the source/drain via 750 has a lateral dimension 760 that is measured in the X-direction, a bottom surface of the source/drain via 750 has a lateral dimension 770 that is measured in the X-direction, where the lateral dimension 760 is substantially greater than the lateral dimension 770. In some embodiments, the lateral dimension 760 is in a range between about 8 nm and about 40 nm, and the lateral dimension 770 is in a range between about 5 nm and about 30 nm. The source/drain via 750 also has a height or a vertical dimension 780 that is measured in the Z-direction. Meanwhile, the ESL 610 has a height or a vertical dimension 790 that is measured in the Z-direction. The vertical dimension 780 is substantially greater than the vertical dimension 790. In some embodiments, the vertical dimension 780 is in a range between about 5 nm and about 25 nm, and the vertical dimension 790 is in a range between about 0.5 nm and about 20 nm. The above ranges for the dimensions 760, 770, 780, and 790 are not randomly chosen but rather specifically configured to maximize the processing window for forming the self-aligning source/drain via 750 without creating additional unintended electrical bridging risks.

Figure 14:
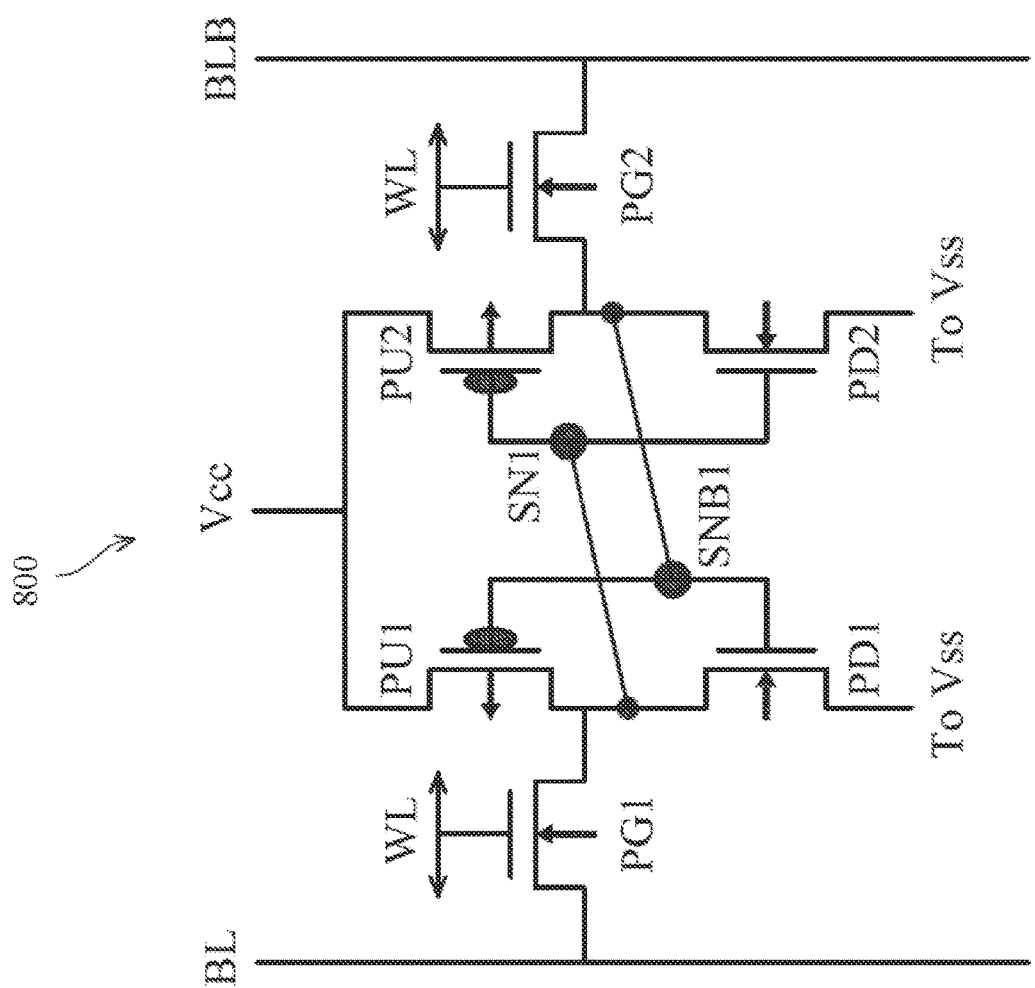
FIG. 14 is a circuit schematic of an SRAM cell according to various aspects of the present disclosure.

The IC device 200 may be implemented in a variety of IC applications, including memory devices such as Static Random-Access Memory (SRAM) devices. In that regard, FIG. 14 illustrates an example circuit schematic for a single-port SRAM cell (e.g., 1-bit SRAM cell) 800. The single-port SRAM cell 800 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. According to the various aspects of the present disclosure, the PG1, PG2, PD1, and PD2 transistors are implemented with thinner spacers than the PU1 and PU2 transistors. Since the SRAM cell 800 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node N1 and the complementary first storage node SNB1 are complementary nodes that are often at opposite logic levels (logic high or logic low). Gates of pass-gate transistors PG1 and PG2 are coupled to a word line WL. SRAM devices such as the SRAM cell 800 may be implemented using "planar" transistor devices, with FinFET devices, and/or with GAA devices.

Figure 15:
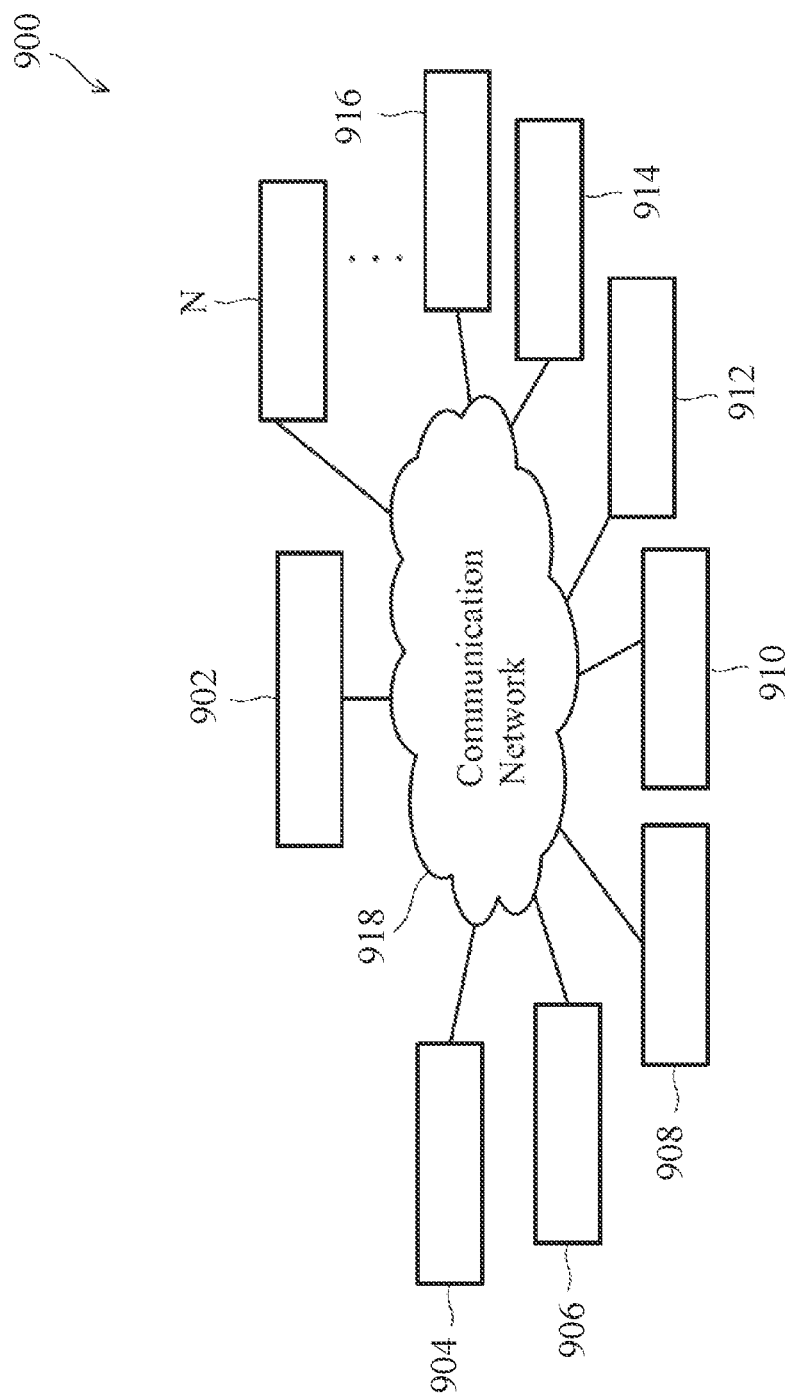
FIG. 15 is a block diagram of a manufacturing system according to various aspects of the present disclosure.

FIG. 15 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such an EUV tool that is used to perform lithography processes to define the gate spacers of an SRAM device; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

FIG. 16 is a flowchart illustrating a method 1000 of fabricating a semiconductor device according to embodiments of the present disclosure. The method 1000 includes a step 1010 to form a gate spacer structure next to a gate that is disposed over a substrate. The gate spacer structure includes a dummy silicon spacer. The substrate includes a source/drain region.

The method 1000 includes a step 1020 to perform a first etching process to the gate and the gate spacer structure. The gate has a lower upper surface than the gate spacer structure after the first etching process.

The method 1000 includes a step 1030 to form a mask layer over the gate and over the gate spacer structure.

The method 1000 includes a step 1040 to form a source/drain contact over the source/drain region.

The method 1000 includes a step 1050 to perform a second etching process to reduce a height of the source/drain contact.

The method 1000 includes a step 1060 to perform a third etching process to shrink the mask layer laterally and to remove the dummy silicon spacer. An air spacer is formed as a result of a removal of the dummy silicon spacer.

The method 1000 includes a step 1070 to form a dielectric structure over the source/drain contact and over the mask layer. The dielectric structure is formed sufficiently wide to cover the air spacer.

In some embodiments, the forming the gate spacer structure comprises forming a gate spacer structure that includes: a first dielectric spacer, a second dielectric spacer, and the dummy silicon spacer. The dummy silicon spacer is formed between the first dielectric spacer and the second dielectric spacer.

In some embodiments, the forming the dielectric structure is performed using a plurality of deposition-etching cycles. In each of the deposition-etching cycles: a dielectric layer is deposited, followed by a dry etching process to etch the dielectric layer.

In some embodiments, the forming the mask layer comprises forming a metal oxide layer as the mask layer. In some embodiments, the depositing the dielectric layer in each of the deposition-etching cycles comprises depositing a silicon nitride layer as the dielectric layer.

In some embodiments, the fourth etching process is performed such that the opening has a cross-sectional profile that resembles a letter "T".

It is understood that the method 1000 may include further steps performed before, during, or after the steps 1010-1070. For example, the method 1000 may include a step of forming a metal layer over the gate but not over the gate spacer structure. The mask layer may be formed over the metal layer. This step may be performed after the first etching process has been performed but before the mask layer has been formed. As another example, the method 1000 may include a step of forming an interlayer dielectric (ILD) over the dielectric structure, performing a fourth etching process to etch an opening through portions of the ILD and the dielectric structure disposed over the source/drain contact, wherein the fourth etching process has a substantially greater etching rate with respect to the ILD than with respect to the dielectric structure, and forming a source/drain via by filling the opening with a conductive material. The method 1000 may also include steps of forming dummy gate structures, forming additional metallization layers, etc. For reasons of simplicity, these additional steps are not discussed herein in detail.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

In summary, the present disclosure forms a protective layer (e.g., an ESL) to protect the gate air spacers during the etching of the source/drain via holes. Such a protective layer is formed as follows: first, source/drain components, gate structures, and gate spacer structure including air spacers are formed. A hard mask layer is formed over a gate and then etched laterally to ensure that the air spacer is exposed. A protective layer is then formed over the air spacer and the hard mask layer using a plurality of deposition-etching cycles. In each of the deposition-etching cycles, a dielectric material having a different material composition from the hard mask layer is deposited, followed by a directional dry etching process. As a result, a thick portion of the protective layer covers the air spacers, but a thin portion of the protective layer covers the source/drain contact. An ILD is then formed over the protective layer, and a source/drain via hole is etched to expose the source/drain contact. The source/drain via hole is then filled by a conductive material to form the source/drain via.

The present disclosure may offer advantages over conventional devices. However, it is understood that not all advantages are discussed herein, different embodiments may offer different advantages, and that no particular advantage is required for any embodiment. One advantage is that undesirable electrical shorting may be prevented. In more detail, as semiconductor feature sizes continue to shrink with each technology generation, a shift of the source/drain via may result in a tiger-tooth profile, such that a portion of the source/drain via extends into the air spacer. This could cause the gate to be electrically shorted to the source/drain via (and therefore the source/drain), which is undesirable. Here, the present disclosure forms a protective layer over the air spacer to protect the air spacer during the source/drain via hole etching. Hence, the risks of electrically shorting the gate with the source/drain are substantially reduced. Another advantage is ease of self-alignment and relaxed process window. Whereas conventional fabrication processes may require an accurate alignment between the source/drain via and the source/drain contact to minimize the risks of the electrical bridging between the gate and the source/drain via discussed above, the present disclosure allows the source/drain via hole to be etched with a much wider top opening. This is because the protective layer serves as a "guide" to automatically align the bottom portion of the source/drain via hole with the source/drain contact. As such, the present disclosure may tolerate misalignment between the source/drain via and the source/drain contact much better than conventional fabrication processes. Other advantages may include compatibility with existing fabrication processes (including for both FinFET and GAA processes) and the ease and low cost of implementation.

One aspect of the present disclosure pertains to a device. The device includes a gate disposed over a substrate. A source/drain is disposed in the substrate. A conductive contact is disposed over the source/drain. An air spacer is disposed between the gate and the conductive contact. A first component is disposed over the gate. A second component is disposed over the air spacer. The second component is different from the first component.

Another aspect of the present disclosure pertains to a device. The device includes a gate disposed over a substrate; a source/drain disposed in the substrate; a source/drain contact disposed over the source/drain; an air spacer disposed between the gate and the source/drain contact; an etching-stop component disposed over the air spacer; and a via disposed over the source/drain contact. An upper segment of the via has a bottom surface that is disposed on an upper surface of the etching-stop component. A lower segment of the via has a bottom surface that is disposed on an upper surface of the source/drain contact and a side surface that is disposed on a side surface of the etching-stop component.

Yet another aspect of the present disclosure pertains to a method. A gate spacer structure is formed next to a gate that is disposed over a substrate. The gate spacer structure includes a dummy silicon spacer. The substrate includes a source/drain region. A first etching process is performed to the gate and the gate spacer structure. The gate has a lower upper surface than the gate spacer structure after the first etching process. A mask layer is formed over the gate and over the gate spacer structure. A source/drain contact is formed over the source/drain region. A second etching process is performed to reduce a height of the source/drain contact. A third etching process is performed to shrink the mask layer laterally and to remove the dummy silicon spacer. Air spacer is formed as a result of a removal of the dummy silicon spacer. A dielectric structure is formed over the source/drain contact and over the mask layer, wherein the dielectric structure is formed sufficiently wide to cover the air spacer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a gate disposed over a substrate;
a source/drain disposed in the substrate;
a conductive contact disposed over the source/drain;
an air spacer disposed between the gate and the conductive contact;
a first component disposed over the gate, wherein a vertical elevation of the air spacer is less than or equal to a vertical elevation of a bottom surface of the first component; and
a second component disposed over the air spacer, the second component wrapping around at least a top surface and side surfaces of the first component, wherein the second component has a slanted and rounded sidewall.

2. The semiconductor device of claim 1, wherein:
the first component contains a metal oxide material; and
the second component contains a dielectric material.

3. The semiconductor device of claim 1, further comprising:
a first dielectric spacer disposed between the gate and the air spacer; and
a second dielectric spacer disposed between the conductive contact and the air spacer.

4. The semiconductor device of claim 3, wherein:
the first dielectric spacer contains a dielectric material having a dielectric constant less than a dielectric constant of about 3.9; and
the second dielectric spacer contains silicon nitride.

5. The semiconductor device of claim 3, wherein the second component is disposed over the first dielectric spacer and over the second dielectric spacer, and wherein the second component is in direct contact with the air spacer.

6. The semiconductor device of claim 5, wherein the second component is disposed partially over the conductive contact.

7. The semiconductor device of claim 1, further comprising:
a conductive via disposed over the conductive contact, wherein the conductive via is in direct contact with an upper surface and a side surface of the second component.

8. The semiconductor device of claim 7, further comprising:
an interlayer dielectric (ILD) disposed over the first component and the second component, wherein:
the conductive via extends vertically through the ILD; and
the conductive via is separated from the first component by the ILD.

9. A semiconductor device, comprising:
a gate disposed over a substrate;
a source/drain disposed in the substrate;
a source/drain contact disposed over the source/drain;
a metal oxide component that is disposed over the gate;
an air spacer disposed between the gate and the source/drain contact, wherein an upper boundary of the air spacer has a vertical elevation that is equal to or below a bottom surface of the metal oxide component;
an etching-stop component disposed over the air spacer, wherein the etching-stop component at least partially wraps around top and side surfaces of the metal oxide component; and
a via disposed over the source/drain contact, wherein:
an upper segment of the via has a bottom surface that is disposed on an upper surface of the etching-stop component; and
a lower segment of the via has a bottom surface that is disposed on an upper surface of the source/drain contact and a side surface that is disposed on a side surface of the etching-stop component.

10. The semiconductor device of claim 9, wherein the etching-stop component is disposed between the metal oxide component and the via, and wherein the lower segment of the via has more curved side surfaces than the upper segment of the via.

11. The semiconductor device of claim 9, further comprising an interlayer dielectric (ILD) that is disposed over the etching-stop component, wherein a side surface of the upper segment of the via is disposed on a side surface of the ILD.

12. The semiconductor device of claim 9, further comprising:
a first dielectric spacer disposed between the air spacer and the gate; and
a second dielectric spacer disposed between the air spacer and the source/drain contact, wherein the first dielectric spacer and the second dielectric spacer have different material compositions.

13. The semiconductor device of claim 9, wherein a side surface of the etching-stop component is slanted and rounded.

14. A semiconductor device, comprising:
a gate formed over a substrate;
a gate spacer structure formed over the substrate and on a side surface of the gate, wherein the gate spacer structure includes dielectric spacers and an air spacer formed between the dielectric spacers;

a metal oxide component formed over the gate but not directly over the air spacer, wherein the metal oxide component is more elevated vertically than the air spacer;

an etching-stop layer (ESL) formed directly over the air spacer, wherein the ESL is disposed on a top surface and a side surface of the metal oxide component;

a source/drain component formed in the substrate;

a source/drain contact formed over the source/drain component; and a source/drain via formed over the source/drain contact, wherein a portion of the source/drain via is formed on a sidewall of the ESL.

15. The semiconductor device of claim 14, wherein:

the metal oxide component contains tantalum oxide ($Ta_2O_5$), aluminum oxide ($Al_2O_3$), or zirconium oxide ($ZrO_2$); and the ESL contains silicon nitride.

16. The semiconductor device of claim 14, wherein at least one of the dielectric spacers contains a high-k gate dielectric material.

17. The semiconductor device of claim 14, wherein a portion of the gate spacer structure is in direct contact with the source/drain contact.

18. The semiconductor device of claim 14, wherein an upper surface of the metal oxide component is formed below a portion of the ESL.

19. The semiconductor device of claim 14, wherein the sidewall of the ESL on which the portion of the source/drain via is formed has a tapered profile in a cross-sectional view.

20. The semiconductor device of claim 14, wherein:

an upper surface of the source/drain via is more elevated than an upper surface of the ESL; and the upper surface of the ESL is in direct physical contact with the source/drain via.

* * * * *